United States Patent [19]

Leussler

[11] Patent Number: 5,003,265
[45] Date of Patent: Mar. 26, 1991

[54] MAGNETIC RESONANCE IMAGING APPARATUS COMPRISING AN RF COIL SYSTEM

[75] Inventor: Christoph G. Leussler, Hamburg, Fed. Rep. of Germany

[73] Assignee: U.S. Philips Corporation, New York, N.Y.

[21] Appl. No.: 350,818

[22] Filed: May 11, 1989

[30] Foreign Application Priority Data

May 18, 1988 [DE] Fed. Rep. of Germany ....... 3816831

[51] Int. Cl.⁵ ............................................. G01R 33/20
[52] U.S. Cl. ..................................... 324/318; 333/219
[58] Field of Search ............... 324/318, 322, 313, 314, 324/309; 333/219

[56] References Cited

U.S. PATENT DOCUMENTS

| | | | |
|---|---|---|---|
| 4,620,155 | 10/1986 | Edelstein | 324/318 |
| 4,812,764 | 3/1989 | Bendall | 324/318 |
| 4,825,162 | 4/1989 | Roemer et al. | 324/318 |
| 4,825,164 | 4/1989 | Requardt | 324/318 |

OTHER PUBLICATIONS

J. S. Hyde et al.; "Surface Coil for MR Imaging of the Skin"; Jun. 15, 1987; pp. 456–460.
D. Murton et al., "Design of a High Homogeneity Transmit Coil for a Vertical Field Imager".

Primary Examiner—Hezron E. Williams
Assistant Examiner—Louis M. Arana
Attorney, Agent, or Firm—William Squire

[57] ABSTRACT

The invention relates to a magnetic resonance imaging apparatus comprising an RF coil. A high Q and a high sensitivity are achieved in that the coil consists of separate resonators which are tuned to the same resonance frequency and which are inductively coupled to one another but not conductively connected to one another.

15 Claims, 1 Drawing Sheet

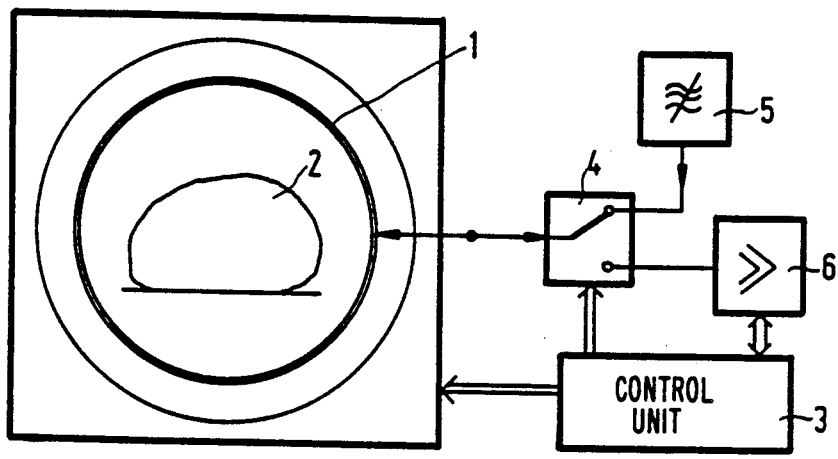
FIG.1
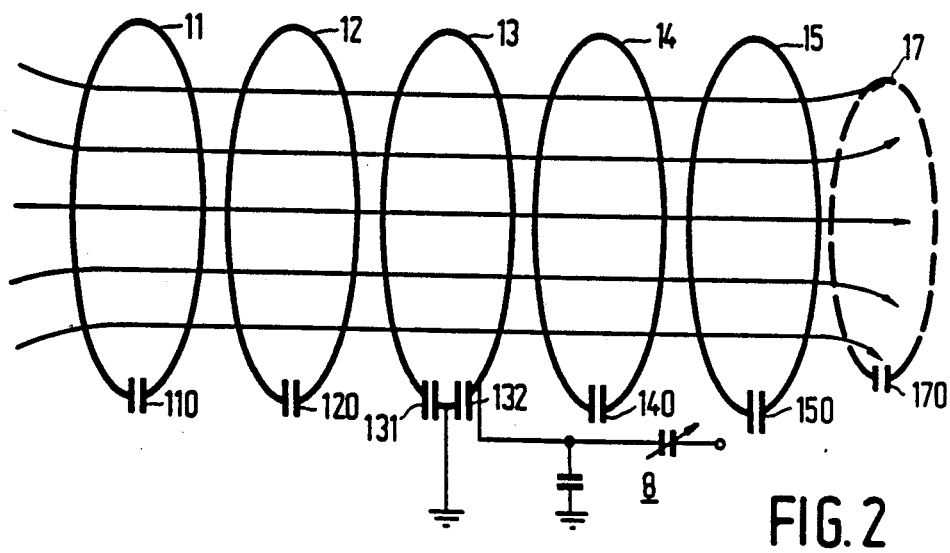
FIG.2
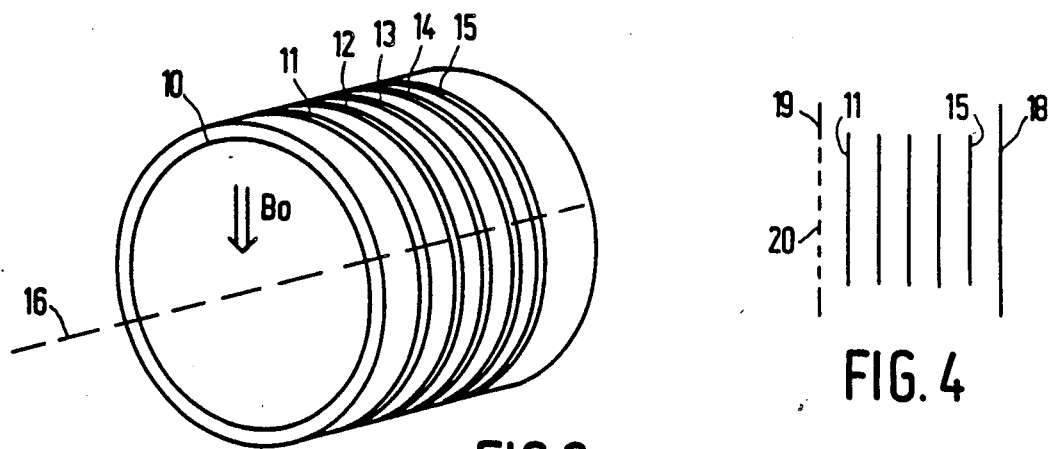
FIG.3
FIG.4

MAGNETIC RESONANCE IMAGING APPARATUS COMPRISING AN RF COIL SYSTEM

BACKGROUND OF THE INVENTION

1. Field of the Invention

The invention relates to a magnetic resonance imaging apparatus, comprising an RF coil system connectable to an RF transmitter and/or an RF receiver.

2. Prior Art

It is known that upon reception of spin resonance signals the signal-to-noise ratio deteriorates as the magnetic flux density of the steady, uniform magnetic field to which the examination zone is exposed during magnetic resonance imaging decreases. In order to achieve an acceptable signal-to-noise ratio in magnetic resonance imaging apparatus with a low magnetic flux density, it is important that the RF coil system detecting the spin resonance signals has a high Q and a high sensitivity. It is known that a so-called solenoid coil comprising an adequate number of turns has such properties. However, the number of turns may only be chosen to be so large that the length of the conductor used to wind the coil amounts to less than one quarter wavelength of the operating frequency, and is preferably small in comparison therewith.

To this end, Murton and Neale disclose a coil system in which two coils, comprising three turns each are connected in parallel. Because of inevitable coil capacitances, however, the self-resonant frequency thereof is still comparatively low; this may give rise to wave propagation effects, causing increased dielectric losses and hence a decreased Q.

It is an object of the present invention to provide an RF coil system for a magnetic resonance imaging apparatus which has an improved signal-to-noise ratio and a relatively high Q factor, even in the case of comparatively low resonance frequencies. This object is achieved in accordance with the invention in that the RF coil system comprises a plurality of resonators which are tuned to the same frequency, each resonator comprising a conductor loop which consists of one or more parts and whose ends are capacitively coupled to one another, resonators which are not conductively connected to one another being inductively coupled to one another, one of the resonators being connectable to the RF transmitter or the RF receiver.

The invention thus utilizes a number of resonators, each of which is formed by a conductor loop, said resonators generally being tuned to the same frequency by means of an additional capacitor. The individual resonators are not conductively connected to one another, but are inductively coupled to one another. Only one of the resonators is connected to the RF transmitter or the RF receiver during operation. Consequently, as regards wave propagation effects and the associated dielectric losses such an RF coil system behaves as an RF coil comprising only a single turn; however, in as far as sensitivity is concerned it acts as a solenoid coil whose number of turns corresponds to the number of resonators.

An RF coil system in acordance with the invention has as many modes of oscillation as there are resonators. In one mode of oscillation the currents flow in the same direction in all resonators. This mode of oscillation relates to the lowest resonance frequency which is lower than the frequency to which the individual resonators are tuned. In another mode of oscillation, the currents in spatially neighbouring resonators always flow in opposite directions. In this mode of oscillation the highest resonance frequency is obtained, which frequency exceeds the frequency whereto the resonators are tuned. This mode of oscillation can be activated only by applying a current having the relevant frequency to one of the resonators; however, it cannot be initiated by an external uniform RF field. Therefore, when an RF coil system in accordance with the invention is used for receiving spin resonance signals it can be completely uncoupled from a transmitter coil operating at the same resonance frequency.

In one embodiment in accordance with the invention a uniform, steady magnetic field acts perpendicularly on the examination zone enclosed by the RF coil system in the operating condition. A patient is usually examined in the recumbent position in a magnetic resonance imaging tomography apparatus. The RF coil system then has a horizontally extending longitudinal axis and generates an RF magnetic field which extends in this direction, the vertical, uniform and steady magnetic field extending perpendicularly thereto in the prescribed manner.

BRIEF DESCRIPTION OF THE DRAWING

The invention will be described in detail hereinafter with reference to the drawing. Therein:

FIG. 1 shows a magnetic resonance imaging tomography apparatus in which the invention can be used.

FIG. 2 shows an electrical circuit diagram,

FIG. 3 shows the geometry of an RF coil in accordance with the invention, and

FIG. 4 shows a modified version of this coil.

DETAILED DESCRIPTION OF THE PREFERRED EMBODIMENTS

The magnetic resonance imaging tomography apparatus shown in FIG. 1 comprises an RF coil system 1 which has a hollow-cylindrical cross-section and which generates an internal RF magnetic field which extends perpendicularly with respect to the plane of drawing and which passes through the examination zone in which the object 2 to be examined is situated, for example a patient whose longitudinal axis extends perpendicularly to the plane of drawing. The magnetic resonance imaging tomography apparatus comprises a main field magnet which is not shown and which generates a steady, uniform magnetic field which extends in the vertical direction with a magnetic flux density of a few tenths of T or less. The steady magnetic field and the RF field thus extend perpendicularly with respect to one another. There are also provided gradient coils (not shown) which generate magnetic fields which also extend in the vertical direction, be it with a respective gradient in each time one of three mutually perpendicular directions.

A control unit 3 controls the generating of the above fields and processes the spin resonance signals received from the examination zone. It controls notably an electronic switch 4 which is used for switching the RF coil system 1 from the transmission mode, in which it is connected to an oscillator 5, to the receiving mode in which it is connected to an RF receiver 6 which amplifies, demodulates and converts the spin resonance signals into a series of digital data words which are processed in the unit 3.

As appears from the FIGS. 2 and 3, the RF coil system 1 consists of a number of resonators 11 . . . 15. The resonators are arranged on a cylindrical supporting body 10 whose central axis 16 extends perpendicularly with respect to the uniform, steady magnetic field $B_0$. Each resonator comprises a conductor loop which annularly encloses the supporting body and which is interrupted in only one location which is capacitively bridged. The conductor loops are situated in parallel planes which preferably extend perpendicularly to the longitudinal axis 16 of the supporting body 10. The capacitance of the capacitors 110 . . . 150 bridging open ends of the conductor loops 11 . . . 15 is chosen so that all resonators are individually tuned to the same resonance frequency. For the central conductor loop 13 tuning is realized by means of two equally large, series connected capacitors 131 and 132 whose junction is grounded. The terminal of one of the two capacitors (132) which is remote from this junction is connected to the switch 4 (FIG. 1) via a matching and tuning network 8.

Instead of being interrupted in each time one location, the conductor loops can alternatively be interrupted in a number of locations which are uniformly distributed over the circumference and which are bridged by a capacitor having a suitable capacitance. The complexity is thus increased, but the dielectric losses occuring during operation are even further reduced or the Q is further enhanced.

The resonators formed by a conductor loop and one or two capacitors are not conductively connected to one another. However, they are inductively coupled to one another because the conductor loops are situated in parallel planes. Because of the absence of a conductive connection between the individual conductor loops, the propagation effects are determined only by the dimensions of the conductor loop 13 to be coupled to the RF transmitter 5 or the RF receiver 6. For a diameter of the tube 10 amounting to 600 mm, the length of such a conductor loop is 2 m or slightly less, but still very small in comparison with one quarter of the wavelength (35 m) occurring for a magnetic flux density of the steady, uniform magnetic field $B_O$ of 0.2 T and the associated spin resonance frequency of approximately 8.5 MHz. On the other hand, the inductive coupling between the various resonators results in a concentration of the magnetic field generated which extends in the direction of the central axis 16 or perpendicularly to the plane of the resonators, as shown in FIG. 2, essentially in the space enclosed by the resonators, like in a solenoid coil comprising a corresponding number of turns. The Q and notably the coil sensitivity, therefore, are better as more resonators are present. Therefore, in practice more than the five resonators shown in the Figures will be used.

In addition to the high field concentration, notably at the centre (at the area of the resonator 13), a further advantage is obtained in that the uniformity of the RF field in the space enclosed by the coil is excellent.

In an RF coil system consisting of a plurality of resonators the number of resonance frequencies corresponds to the number of resonators; the resonance frequency is the frequency for which the ratio of the energy in the resonator to the energy applied to the resonator is maximum. The resonance frequencies, therefore, are spaced further apart as the inductive coupling between the individual resonators is stronger, i.e. as the conductor loops are situated nearer one another. Each resonance frequency is linked to another mode of oscillation. The lowest resonance frequency occurs when a current flows in the same direction in all resonators. This resonance frequency is lower than the frequency whereto the individual resonators are tuned. The highest resonance frequency occurs when the direction in which the current flows is reversed from one resonator to another; this frequency is substantially higher than the frequency whereto the resonators are tuned. The advantage of this mode of oscillation consists in that it cannot be activated by a uniform external magnetic field. When such a coil system operates as a receiver coil in the field of an (additional) transmitter coil, a high degree of uncoupling is obtained between the coils, notably when the receiver coil consists of an even number of resonators. It is advantageous that customary transmitter coils are usually also situated on a cylindrical surface, but generate a field perpendicular to the cylinder axis. Thus, the receiver coils can be arranged inside the transmission coil, so as to be concentric therewith.

In a practical embodiment of an RF coil for magnetic resonance imaging of the head seven resonators were arranged on a supporting body having a diameter of 320 mm. Each resonator consisted of a copper tube having a wall thickness of 12 mm; this copper tube was tuned to a frequency of approximately 11 MHz by means of a capacitor of 320 pF. The spacing of the conductor loops amounted to 20 mm. This system operated at the lowest resonance frequency which amounted to 6.8 MHz. This resulted in a Q-unloaded of 120 and in a Q-loaded of approximately 280. At such resonator frequencies saddle coils have similarly high unloaded and loaded Q factors, so that their performance is not inferior in the transmission mode. However, the sensitivity of a saddle coil is approximately 40% lower, so that the RF coil system in accordance with the invention offers substantial advantages in the receiving mode. In the direction of lower frequencies the Q of an RF coil system in accordance with the invention decreases far less than that of a saddle coil, so that for even lower frequencies advantages are obtained also as regards the transmission mode.

An RF coil having a circular cross-section was described. The RF coil, however, may also have a different cross-section above, for example an elliptical or a square cross-section. The centres or the centroids of the surfaces enclosed by the individual conductor loops should then be situated on a common straight line, and the mutually parallel planes in which the conductor loops are situated should intersect this line as perpendicularly as possible.

Not all conductor loops need be equally large. As is denoted by broken lines in FIG. 2, there may be provided a further conductor loop 17 which is concentrically arranged with respect to the central axis 16 and which has a smaller diameter. This conductor loop must be tuned to the same frequency as the other resonators; however, because of the lower inductance of this loop a capacitor 170 having a higher capacitance will then be required. The effect of this smaller resonator, being situated at one end of the RF coil system, consists in that the magnetic flux density in the axial direction decreases even stronger in the outward direction, so that the magnetic field is concentrated even more in the space enclosed by the coil. When the generator or the receiver is not connected to the central resonator 13 but to the resonator 15 adjoining the coil 17, a stronger decrease of the magnetic field is obtained also towards the other side of the coil. When such an RF coil is used as a head coil, advantages are obtained in that less RF energy is applied to the head and shoulder region then situated to the left of the resonator 11, so that the Q of the coil is influenced less by this area.

In FIG. 4 a conductive shield 18 which is made of a copper foil having a thickness of 30 μm and which extends perpendicularly to the coil axis is arranged at the side of the coil which is remote from the patient entrance side. This shield increases the field in the centre of the coil, thus providing an additional field concentration and hence a better signal-to-noise ratio.

In the case of use as a head coil, on the side of the coil where the head of the patient is introduced there may be provided a further shield 19 in which an opening (denoted by the broken line 20 in FIG. 4) for the head of the patient is provided. This shield shields the shoulder area of the patient against stray fields which otherwise represent an additional load for the patient.

I claim:

1. In a magnetic resonance imaging apparatus including an RF coil system coupled to an RF transmitter and/or an RF receiver, said transmitter and receiver each having an operating frequency, said RF coil system comprising a plurality of spaced resonators which are tuned to the same frequency, each resonator comprising a conductor loop having a pair of spaced ends, capacitor means coupled to each loop for capacitively coupling the ends of a respective loop to one another, said resonators being so spaced from one another so as to be inductively coupled to one another, one of the resonators including means adapted to be electrically coupled to the RF transmitter and/or RF receiver, said resonators being arranged in a row, an end resonator of the row having the same shape as but smaller loop dimension than the other resonators.

2. The coil system as claimed in claim 1, characterized in that the conductor loops of the resonators are situated in parallel planes, the centres of the loops being situated on a common straight line.

3. The coil system as claimed in claim 1, further including a The coil system as claimed in claim 1 further including a member having a cylindrical surface, said resonators being secured about the cylindrical surface of said member.

4. The coil system as claimed in claim 1 wherein the system has a range of resonant frequencies, the transmission frequency or the receiving frequency of the respective transmitter and receiver corresponding to the lowest resonance frequency of the range of frequencies of the RF coil system.

5. The coil system as claimed in claim 1 wherein the system has a range of resonant frequencies, the transmission frequency or the receiving frequency of the respective transmitter and receiver corresponding to the highest resonance frequency of the range of frequencies of the RF coil system.

6. The coil system as claimed in claim 5, characterized in that the RF coil system is formed by an even number of resonators.

7. The coil system as claimed in claim 1 wherein the apparatus includes a patient examination zone enclosed by the coil system, said coil system including means such that in the operating condition a perpendicularly extending uniform, steady magnetic field ($B_o$) acts on the examination zone enclosed by the RF coil system.

8. The coil system as claimed in claim 1 further including a transmitter coil having a given axis, the RF coil system said transmitter coil so as to be concentric therewith, said transmitter coil generating an RF field extending in a given direction, the RF field of said transmitter coil extending perpendicularly to the coil axis.

9. The coil system as claimed in claim 1 wherein the system has opposing ends, the system further including a conductive shield adjacent to at least one of the ends of the coil system.

10. The coil system as claimed in claim 9 wherein the system is adapted to receive a patient at said one end, the shield having an opening for receiving the patient therethrough.

11. The coil system as claimed in claim 2 further including a member having a cylindrical surface, said resonators being secured about the cylindrical surface of said member.

12. The coil system as claimed in claim 2 wherein said resonators are arranged in a row, an end resonator of the row having the same shape as but smaller loop dimension than the other resonators.

13. The coil system as claimed in claim 2 wherein the system has a range of resonant frequencies, the transmission frequency or the receiving frequency of the respective transmitter and receiver corresponding to the lowest resonance frequency of the range of frequencies of the RF coil system.

14. The coil system as claimed in claim 2, characterized in that the RF coil system is formed by an even number of resonators.

15. The coil system as claimed in claim 2 further including a transmitter coil having a given axis, the RF coil system being inside said transmitter coil so as to be concentric therewith, said transmitter coil generating an RF field extending in a given direction, the RF field of said transmitter coil extending perpendicularly to the coil axis.

* * * * *